United States Patent
Kim et al.

(10) Patent No.: US 7,683,725 B2
(45) Date of Patent: Mar. 23, 2010

(54) SYSTEM FOR GENERATING A MULTIPLE PHASE CLOCK

(75) Inventors: Kyu-hyoun Kim, Mount Kisco, NY (US); Paul W. Coteus, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 11/838,282

(22) Filed: Aug. 14, 2007

(65) Prior Publication Data
US 2009/0045882 A1 Feb. 19, 2009

(51) Int. Cl.
H03K 3/03 (2006.01)
(52) U.S. Cl. .............. 331/57; 331/45; 331/46; 331/55; 331/177 R
(58) Field of Classification Search ............. 331/45, 331/46, 55, 57, 177 R
See application file for complete search history.

(56) References Cited

U.S. PATENT DOCUMENTS

| | | | |
|---|---|---|---|
| 5,357,217 A * | 10/1994 | Marchesi et al. | 331/57 |
| 5,513,135 A | 4/1996 | Dell et al. | |
| 5,592,126 A * | 1/1997 | Boudewijns et al. | 331/45 |
| 5,592,127 A * | 1/1997 | Mizuno | 331/57 |
| 5,635,877 A * | 6/1997 | Monk et al. | 331/57 |
| 5,917,383 A | 6/1999 | Tso et al. | |
| 6,025,756 A | 2/2000 | Miyabe | |
| 6,381,685 B2 | 4/2002 | Dell et al. | |
| 6,617,936 B2 * | 9/2003 | Dally et al. | 331/57 |
| 7,071,789 B2 * | 7/2006 | Gu | 331/57 |
| 7,199,630 B2 * | 4/2007 | Kim | 327/158 |
| 2005/0057316 A1 * | 3/2005 | Kim | 331/57 |
| 2006/0001496 A1 * | 1/2006 | Abrosimov et al. | 331/57 |
| 2007/0090867 A1 * | 4/2007 | Kim | 327/291 |
| 2007/0241826 A1 * | 10/2007 | Ueno | 331/57 |
| 2008/0054944 A1 * | 3/2008 | Kwon | 326/83 |

OTHER PUBLICATIONS

Ansgar Pottbacker, et al., ISSCC94/Session 6/Clock and Data Recovery/Paper TA 6.5, T.A. 6.5: An 8GHz Silicon Bipolar Clock-Recovery and Data-Regenerator IC, 1994 IEEE International Solid-State Circuits Conference, 2 pages.

William Shing Tak Yan, et al., A 900-MHz CMOS Low-Phase-Noise Voltage-Controlled Ring Oscillator, IEEE Transactions on Circuits and Systems-II: Analog and Digital Signal Processing, vol. 48, No. 2, Feb. 2001, pp. 216-221.

Markus Grozing, et al., CMOS Ring Oscillator with Quadrature Outputs and 100 MHz to 3.5 GHz Tuning Range, Copyright 2003 IEEE, pp. 679-682.

* cited by examiner

*Primary Examiner*—Arnold Kinkead
*Assistant Examiner*—Richard Tan
(74) *Attorney, Agent, or Firm*—Cantor Colburn LLP

(57) ABSTRACT

A system for generating a multiple phase clock is provided. The system includes a ring oscillator structure for generating multiple phases. The structure includes two or more unit oscillators, each unit oscillator implemented by a ring oscillator having M stages. The structure also includes a horizontal loop coupling the two or more unit oscillators to generate multiple phases. The number of phases generated is equal to the product of the number of unit oscillators and M. Another structure generates multiple phases using a multi-dimensional oscillator including ring oscillators constructed as vertical and horizontal loops with shared elements between the oscillators. A memory system includes a ring oscillator structure with vertical and horizontal loops, the ring oscillator structure receiving an input clock and outputting a multiple phase clock to one or more of a memory controller, memory devices and a memory interface device.

6 Claims, 7 Drawing Sheets

SYSTEM FOR GENERATING A MULTIPLE PHASE CLOCK

BACKGROUND OF THE INVENTION

This invention relates generally to clock generation, and more particularly to generating a multiple phase clock.

Contemporary high performance computing main memory systems utilize high per-pin data rates to achieve high data bandwidth. Per-pin data rates can be increased by sending more data bits in a given clock period (e.g. a memory clock cycle). For example, a contemporary Fully Buffered DIMM (FBDIMM) transmits twelve data bits in the equivalent of a single memory clock cycle time. Further, some special purpose contemporary dynamic random access memories (DRAMs) transmit eight data bits in a single memory clock cycle time. To achieve this, multiple clock phases are required which must be developed by circuitry located in a device(s) within the main memory, within the memory controller, within the local clocking device, within the memory interface device (MID), and/or within other clock generation devices/circuitry. Other electronic devices and/or interfaces also require precise multiple clock phase generation, for example, some high-speed digital video disk (DVD) devices require sixty-three phases.

There are two conventional methods to generate multiple phases. The first is to divide the output of the voltage controlled oscillator (VCO). For example, dividing (e.g. via a toggle flip flop) a differential clock by two, then by two a second time, would generate eight phases. However, this requires the VCO circuitry to operate at a much higher frequency (four times in this case) and results in higher power requirements. The other method is to use a multiple stage ring oscillator. The latter case, however, decreases the output frequency inversely proportional to the number of phases. Therefore, it would be highly desirable to be able to generate multiple clock phases in a manner that provides for a minimum impact on the output frequency while consuming a relatively small amount of power.

BRIEF SUMMARY OF THE INVENTION

An embodiment includes a ring oscillator structure for generating multiple phases. The structure includes two or more unit oscillators, each unit oscillator implemented by a ring oscillator having M stages. The structure also includes a horizontal loop coupling the two or more unit oscillators to generate multiple phases. The number of phases generated is equal to the product of the number of unit oscillators and M.

Another embodiment includes a ring oscillator structure for generating multiple phases using a two-dimensional oscillator. The structure includes a first unit oscillator and a second unit oscillator. The first unit oscillator is implemented by a first ring oscillator constructed as a vertical loop. The second unit oscillator is implemented by a second unit oscillator implemented by a second ring oscillator constructed as a horizontal loop. Elements of the first unit oscillator are shared with elements of the second unit oscillator.

A further exemplary embodiment includes a memory system having a memory controller, a plurality of memory devices, a memory interface device, and a ring oscillator structure. The memory interface device is in communication with the memory controller and the memory devices. The ring oscillator structure includes input nodes for receiving an input clock from one or more of the memory controller, the memory devices and the memory interface device. The structure also includes a first unit oscillator, a second unit oscillator, and one or more output nodes. The first unit oscillator is implemented by a first ring oscillator constructed as a vertical loop. The second unit oscillator is implemented by a second ring oscillator constructed as a horizontal loop. Elements of the first unit oscillator are shared with elements of the second unit oscillator. The output nodes output a multiple phase clock to one or more of the memory controller, the memory devices and the memory interface device.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

An exemplary embodiment of the present invention provides a low-power clock generation method for use by high-speed memory devices (e.g., memory controllers, main memory devices, and memory interface devices such as hubs and buffers) and general high-speed communication interfaces (e.g., serial links). Exemplary embodiments utilize cross-wired ring oscillators to generate high speed clocks having multiple phases without post frequency dividing, thus resulting in a reduced total power consumption.

Exemplary embodiments include a novel method to generate multiple phase clocks, in addition to a multiple phase-generating PLL architecture. An exemplary embodiment couples two or more oscillators to produce the number of total phases, with the number of phases equal to a multiplication of the number of phases from a unit oscillator times the number of unit oscillators.

Figure 1:
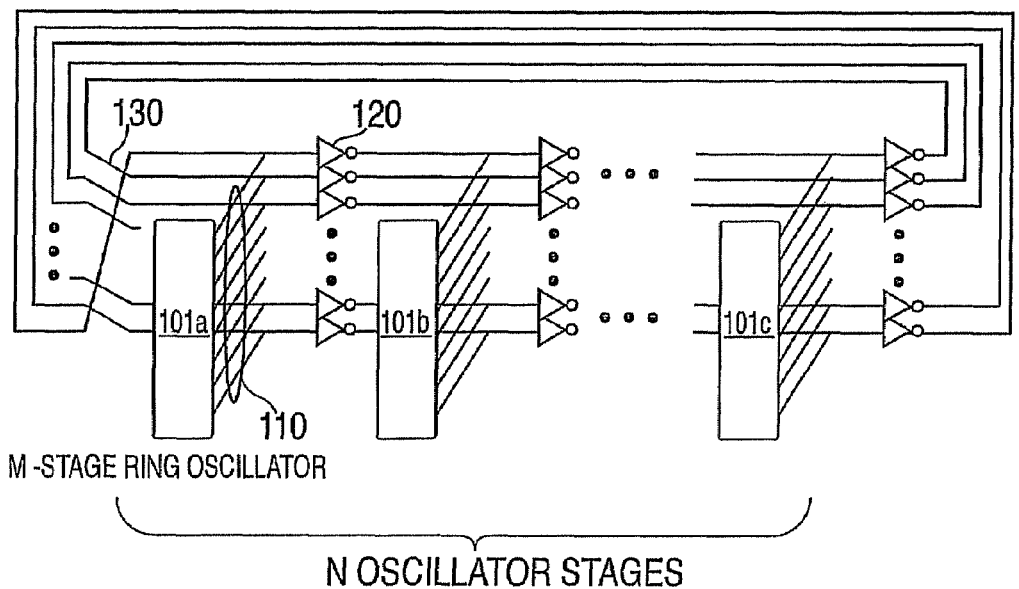
FIG. 1 depicts an exemplary cross-wired multiphase oscillator structure that may be implemented by an exemplary embodiment.

FIG. 1 depicts an exemplary cross-wired multiphase oscillator structure that may be implemented by an exemplary embodiment. It is composed of "N" unit oscillators 101 (where "N" is the number of unit oscillators) each of which is an M-stage oscillator (where "M" is the number of inverters comprising the ring oscillator). Each output node 110 of a unit oscillator 101 is coupled to the corresponding output node of the next stage unit oscillator 101 (e.g. the first stage oscillator 101a and the second stage oscillator 101b) through inverters 120. Outputs at the final stage unit oscillator 101c are fed back 130 to the first stage oscillator 101a but shifted by a certain amount. FIG. 1 depicts a shift of one. However, a larger shift may be required in some applications to achieve the desired operation.

It should be noted that in the exemplary embodiment depicted in FIG. 1, every node in the circuit has an identical environment (e.g. loading, drive strength and relative location within the whole circuit). Therefore, all nodes would have equally distributed phases and operate at the same frequency. In this exemplary embodiment the number of total phases would be equal to the number of total nodes (N) multiplied by the number of stages in each node (M).

Figure 2:
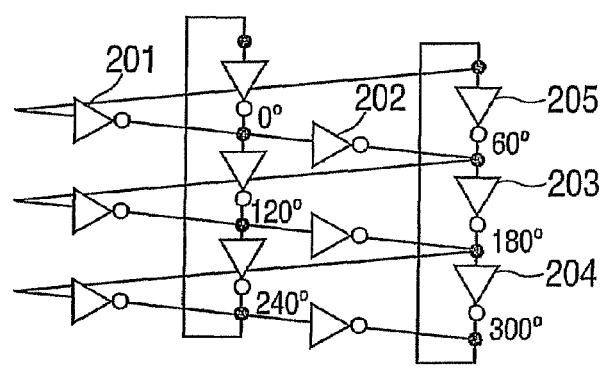
FIG. 2 depicts an exemplary cross-wired multiphase oscillator structure with three stages and two unit oscillators that may be implemented by an exemplary embodiment.

FIG. 2 depicts an exemplary cross-wired multiphase oscillator structure with three stages and two unit oscillators that may be implemented by an exemplary embodiment. The structure in FIG. 2 generates six phases (M=3 and N=2) while oscillating at substantially the same frequency as that of the original three-stage single oscillator. The six outputs in FIG. 2 are labeled 0°, 60°, 120°, 180°, 240°, and 300°. The oscillation frequency of the circuit shown in FIG. 2 is determined by two paths. One path is the original three stage inverter loop (the vertical loop comprised of inverters 205, 203, and 204). The other path is a horizontal loop which is comprised of two horizontal inverters (201, 202) and 2 vertical inverters (203, 204), with inverter 204 looping back to the input to inverter 201. The horizontal loop has four inverter stages. Therefore, the oscillation frequency is in between the oscillation frequencies of 3-stage and 4-stage oscillators.

The use of the term "horizontal loop" may in some cases be initially misleading, as the horizontal loops described may sometimes include vertical inverters (as indicated in at least some of the figures such as 4A below, and by the physical layout of the devices when the circuits are constructed). The term horizontal loop, therefore, is used herein to delineate a distinctly separate loop from the more obvious vertical loop structures. In practicing exemplary embodiments of the present invention, several, isolated ring oscillators (e.g. vertical loops, in figures shown) are connected via one or more "horizontal loops", that share some of the same inverter elements of the vertical loops, and may include inverters that are horizontally or vertically placed in the figure(s). The term horizontal loop, therefore, refers to the interconnection means between the otherwise isolated vertical (ring oscillator) loops. Further, by practicing exemplary embodiments of the present invention as described herein, ring oscillator structures can be created that consist of even numbers of inverters, through innovative interconnections to other ring oscillators (also having an even number of inverters) via said "horizontal loops."

Figure 3:
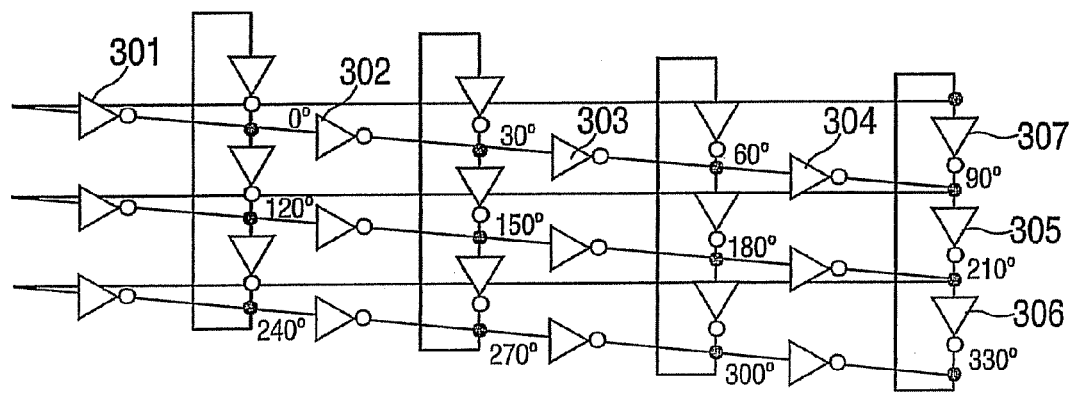
FIG. 3 depicts an exemplary cross-wired multiphase oscillator structure with three stages and four unit oscillators that may be implemented by an exemplary embodiment.

FIG. 3 depicts an exemplary cross-wired multiphase oscillator structure with three stages and four unit oscillators that may be implemented by an exemplary embodiment. The multiphase oscillator structure in FIG. 3 generates a total of twelve phases (the number stages multiplied by the number of unit oscillators). The twelve outputs in FIG. 3 are labeled 0°, 30°, 60°, 90°, 120°, 150°, 180°, 210°, 240°, 270°, 300°, and 330°. The oscillation frequency of the circuit shown in FIG. 3 is determined by two paths. One path is the original three stage inverter loop (the vertical loop comprised of inverters 307, 305, and 306). The other path is a horizontal loop which is comprised of four horizontal inverters (301, 302, 303, and 304) and 2 vertical inverters (305 and 306), with inverter 306 looping back to the input to inverter 301. The horizontal loop has six inverter stages. Therefore, the oscillation frequency is in between the oscillation frequencies of 3-stage and 6-stage oscillators. Twelve clock phases may be utilized by contemporary products such as a fully buffered dual inline memory module (FBDIMM).

Figure 4A:
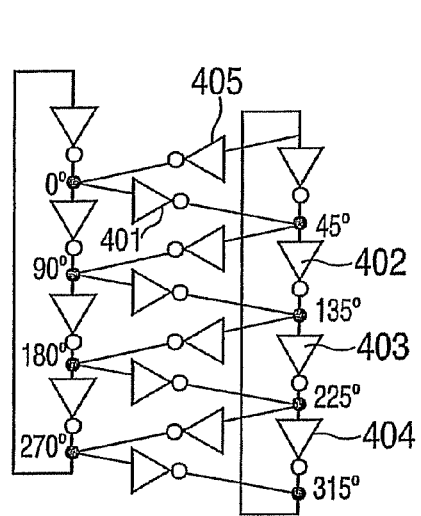
FIGS. 4A and 4B depict exemplary cross-wired multiphase oscillator structures with four stages and two unit oscillators that may be implemented by exemplary embodiments.
Figure 4B:
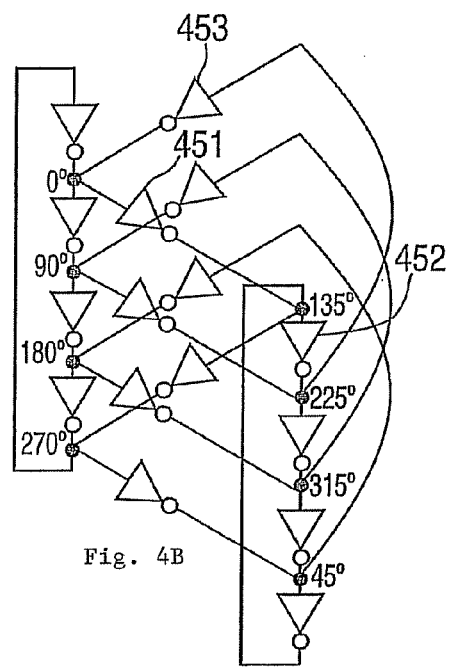

FIGS. 4A and 4B depict exemplary cross-wired eight phase oscillator structures with four stages (M=4) and two unit oscillators (N=2) that may be implemented by exemplary embodiments. The eight outputs in FIGS. 4A and 4B are labeled 0°, 45°, 90°, 135°, 180°, 225°, 270° and 315°. FIGS. 4A and 4B depict two possible ways of implementing the feedback (shift) in the oscillator structures. FIG. 4A shows a shift by one method (e.g. one inverter) and FIG. 4B shows a shift by three method (e.g. three inverters). The two examples have different oscillation frequencies. FIG. 4A has five inverter stages within its horizontal loop as shown in gray (inverters 401, 402, 403, 404 and 405), while FIG. 4B has three inverters within its horizontal loop as shown in gray (inverters 451, 452 and 453). Due to the reduced number of inverters, the circuit shown in FIG. 4B operates at a higher frequency than the circuit shown in FIG. 4A.

Figure 5:
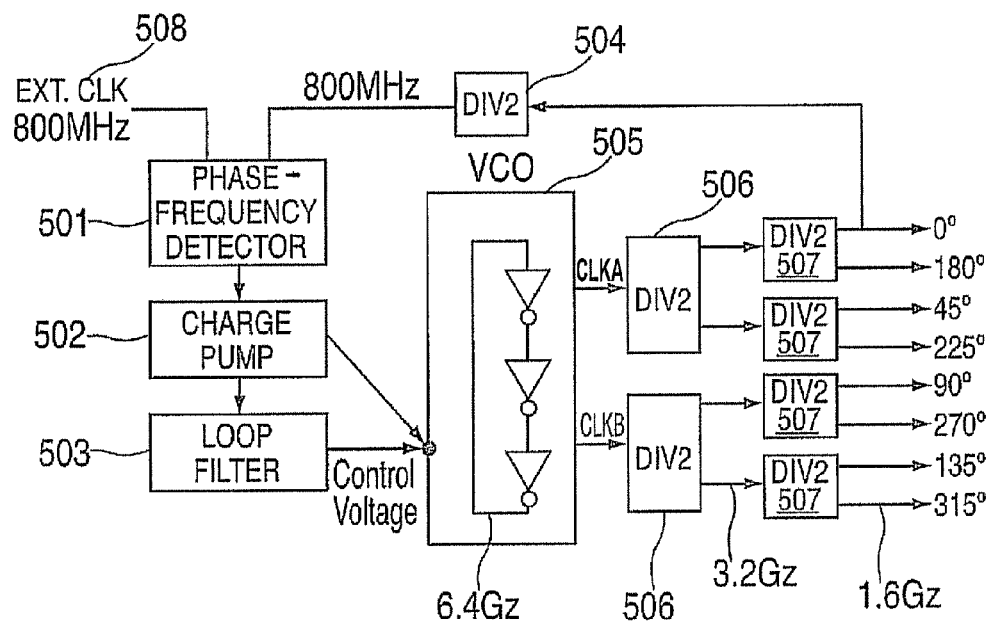
FIG. 5 depicts an exemplary PLL for an OCR device.

FIG. 5 depicts an exemplary PLL for an octal data rate (OCR) device. In the conventional method, as depicted in FIG. 5, output clocks out of a VCO 505 are divided twice (e.g. via toggle flip-flops 506 and 507) to obtain eight phases. Therefore, the VCO 505 needs to operate at 6.4 GHz for the data rate of 12.8 Gb/s/pin (gigabits per second per pin) as shown in FIG. 5. Using double data rate (DDR) devices, operating with two inputs and/or outputs per clock cycle, a 6.4 GHz clock to the DDR memory devices would enable 12.8 Gb/s data rates to/from the memory devices. Also included in the simplified clock circuit shown in FIG. 5 is an external clock input 508 of 800 MHz, a phase frequency detector 501 (e.g. a device which compares the phase of two input signals and includes outputs to facilitate locking the phase relationships), a charge pump 502 (e.g. a circuit that uses capacitors as energy storage elements to create a higher or lower power source), a loop filter 503 (e.g. a capacitor or resistor-capacitor network to filter the signal), the VCO 505 (e.g. comprised of a multi-stage ring oscillator, outputting two clocks, CLKA and CLKB, generally having a 180 degree phase difference) and several DIV2 (divide by 2) elements 504, 506 and 507, as previously described.

Figure 6:
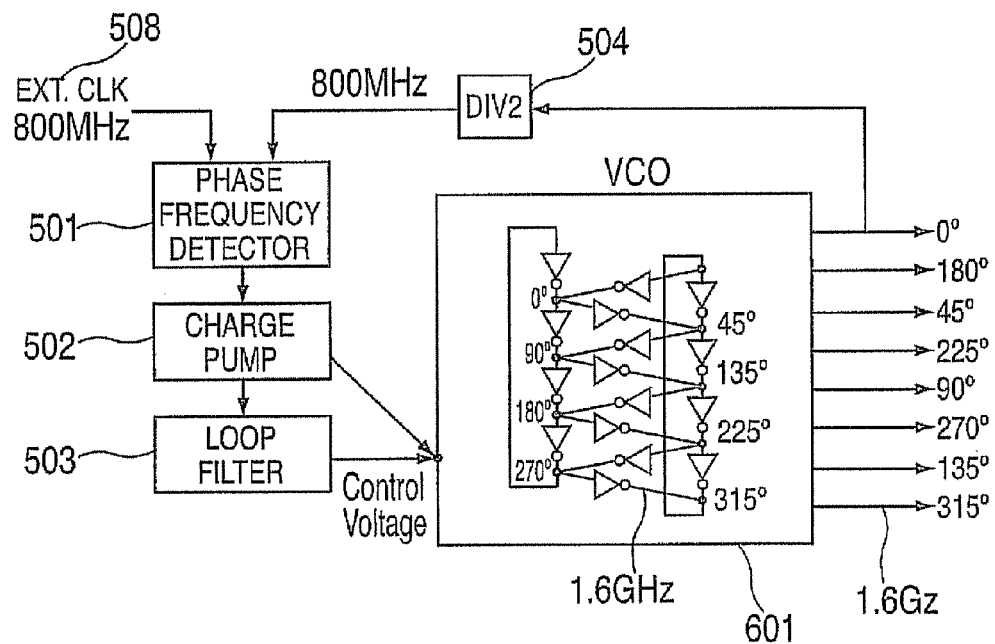
FIG. 6 depicts an octal phase generating VCO that may be implemented by an exemplary embodiment.

FIG. 6 depicts an octal phase generating VCO that may be implemented by an exemplary embodiment using an octal phase generating structure (may be referred to as a VCO) such as that depicted in FIG. 4A or 4B. In this exemplary embodiment, the frequency of the VCO 601 is the same of that of the final clock frequency (i.e., 1.6 GHz). Therefore, the VCO power requirement is significantly reduced (when compared to the VCO 505 depicted in FIG. 5), due primarily to the lower VCO frequency enabled by the exemplary oscillator.

Figure 7:
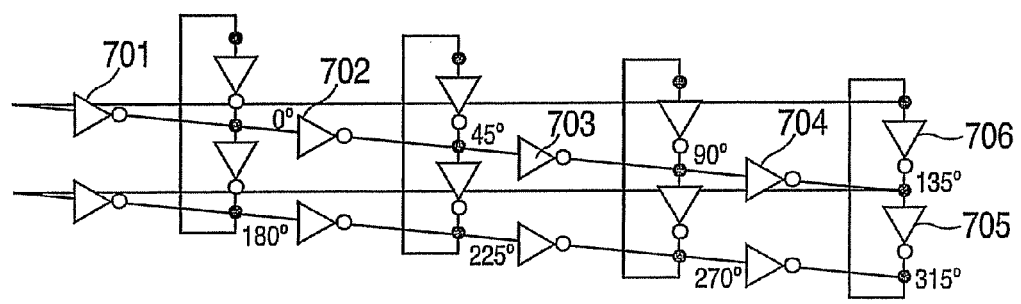
FIG. 7 depicts an octal phase generating VCO that may be implemented by an exemplary embodiment.

FIG. 7 depicts an alternate exemplary embodiment of a structure (also referred to herein as a circuit), such as a VCO, for generating eight phases using a cross wired oscillator with M=2 and N=4. In general, a two-stage single-ended inverter ring oscillator does not oscillate by itself, nor does a four-stage oscillator. However, in the exemplary cross-wired architecture shown, these oscillators are utilized and offer the advantages of one or more of lower power and higher frequency operation. As depicted in FIG. 7, the vertical oscillator is a two-stage ring oscillator (which would not oscillate by itself), with four such (vertical) two-stage ring oscillators shown interconnected by the exemplary horizontal ring. One of the four vertical rings in FIG. 7 includes inverters 706 and 705. One of the two horizontal rings in FIG. 7 includes inverters 701, 702, 703, 704 and 705. As clarification, this horizontal ring is comprised of the inverters placed between nodes 0 and 45, then 45 and 90, then 90 and 135, then 135 and 315, and then back to the inverter to the left of the node 0 (inverter 701). Given that there are two horizontal rings in the structure depicted in FIG. 7, eight phases are generated for every clock cycle time.

Figure 8:
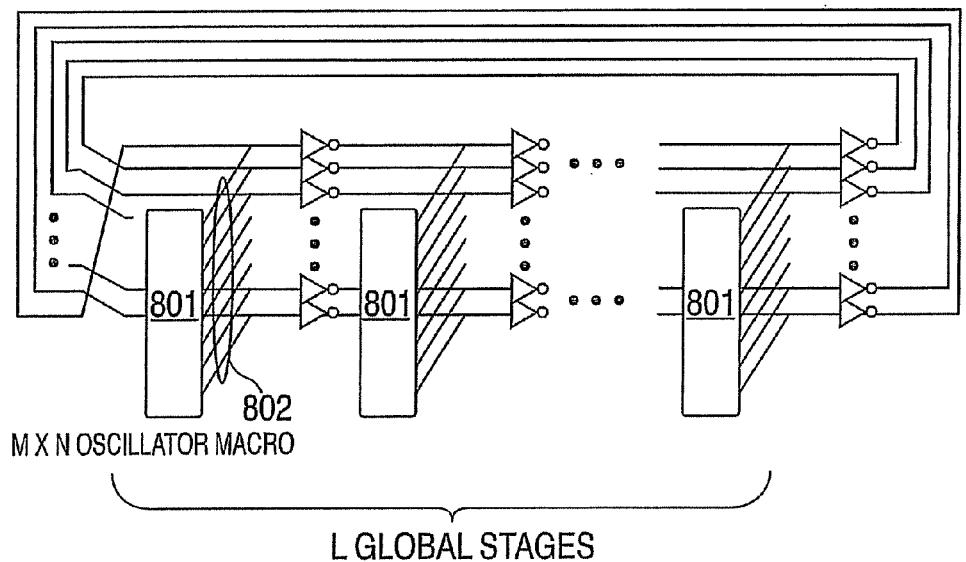
FIG. 8 depicts an exemplary cross-wired multiphase oscillator structure that may be implemented by an exemplary embodiment.

The exemplary circuit structures described herein can be described as two-dimensional oscillators (with vertical and horizontal loops), when compared to conventional ring oscillators which have only a single inverter loop (with a vertical loop) which can be described as one-dimensional oscillators. In exemplary embodiments, more than one two-dimensional oscillator is cross-wired to construct a "three-dimensional oscillator" (consistent with the naming convention previously described). In this case, an M×N cross-wired oscillator, such as the one depicted in FIG. 1, is treated as a unit oscillator. FIG. 8 depicts an exemplary construction and operation of a three-dimensional oscillator. In this case, the total number of phases is equal to the product of M, N and L (i.e., M×N×L), where "L" represents the number of stages. "M" and "N" continue to comprise a single stage with both vertical and horizontal loop oscillators. The example depicted in FIG. 8 depicts "L" stages each including an oscillator structure 801 generating eight outputs 802. Thus, the oscillator structure 801 may be implemented by the circuits depicted in FIGS. 4A, 4B and 7. In the example three-dimensional oscillator depicted in FIG. 8, a shift of one is implemented, however, larger shifts may also be implemented. The generation of eight outputs is intended to be an example, as other numbers of outputs (e.g., four, six, nine, ten, twelve, etc.) may be generated by a three-dimensional oscillator.

In an exemplary embodiment, using M=3, N=7 and L=3, 63 clock phases within a clock cycle (e.g. a single memory clock cycle) can be obtained without degradation of the maximum operating frequency that would result from contemporary designs using twenty-one or sixty-three stage ring oscillators which would exhibit a much lower maximum oscillation frequency.

Figure 9:
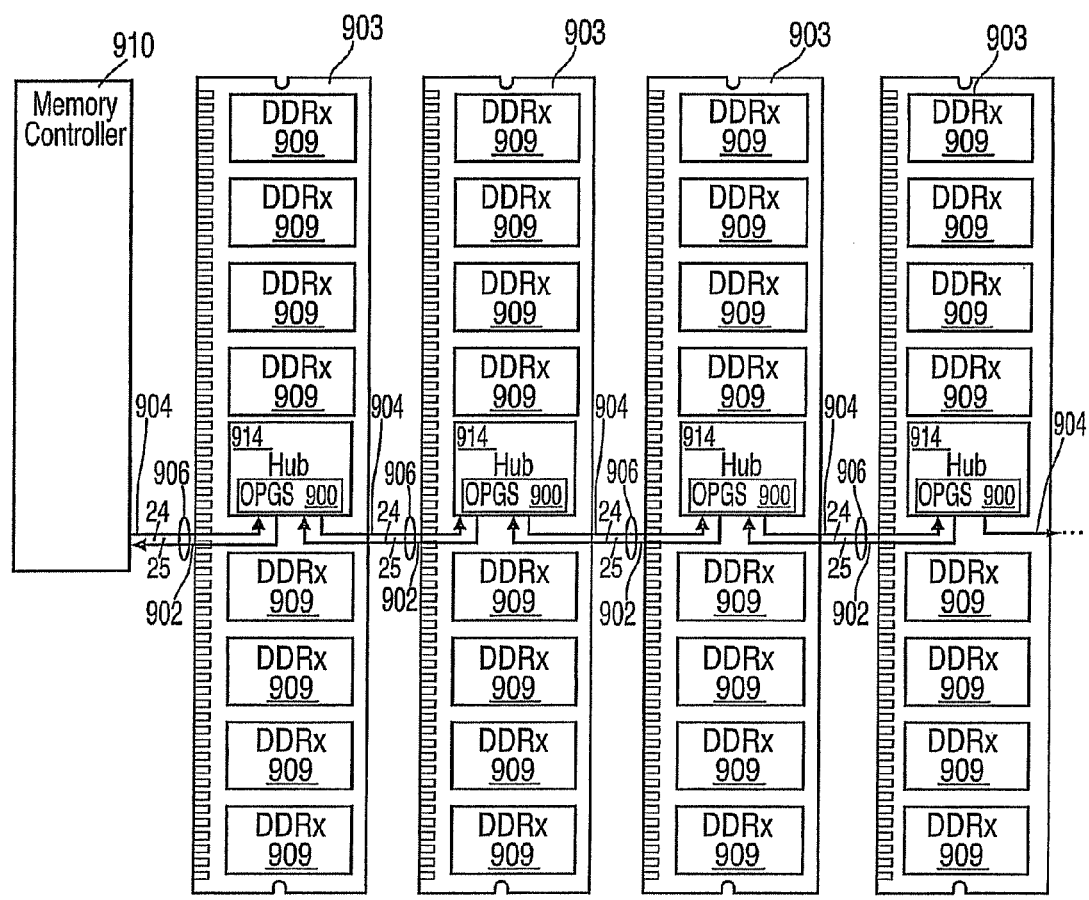
FIG. 9 depicts a memory structure that may be implemented by an exemplary embodiment.

FIG. 9 depicts a memory structure that may be implemented by an exemplary embodiment. FIG. 9 depicts a memory structure with cascaded memory modules 903, high speed DDRx (x=a future DDR device configuration) memory devices 909, a hub device 914 and unidirectional busses 906 that may be implemented by exemplary embodiments. The unidirectional busses 906 include an upstream memory bus 902 and a downstream memory bus 904. The hub device 914 includes a two-dimensional oscillator octal phase generating structure 900 (e.g., structure depicted in FIGS. 4A, 4B and 7) for developing eight phase clock signals from differential clock(s) extracted from the downstream bus 906. The octal phase generating structure (OPGS) 900 may be replaced in the hub device 914 by any two-dimensional or three-dimensional oscillator structure such as those described herein. The eight phase clock signals developed in the hub device 914 connect to one or more DDRx memory devices 909, providing a high speed memory clock consistent with the operation of a DDRx memory device which transfers data on each edge of an externally supplied octal clock (e.g. 8 data transfers per full 360 degree clock period).

Figure 10:
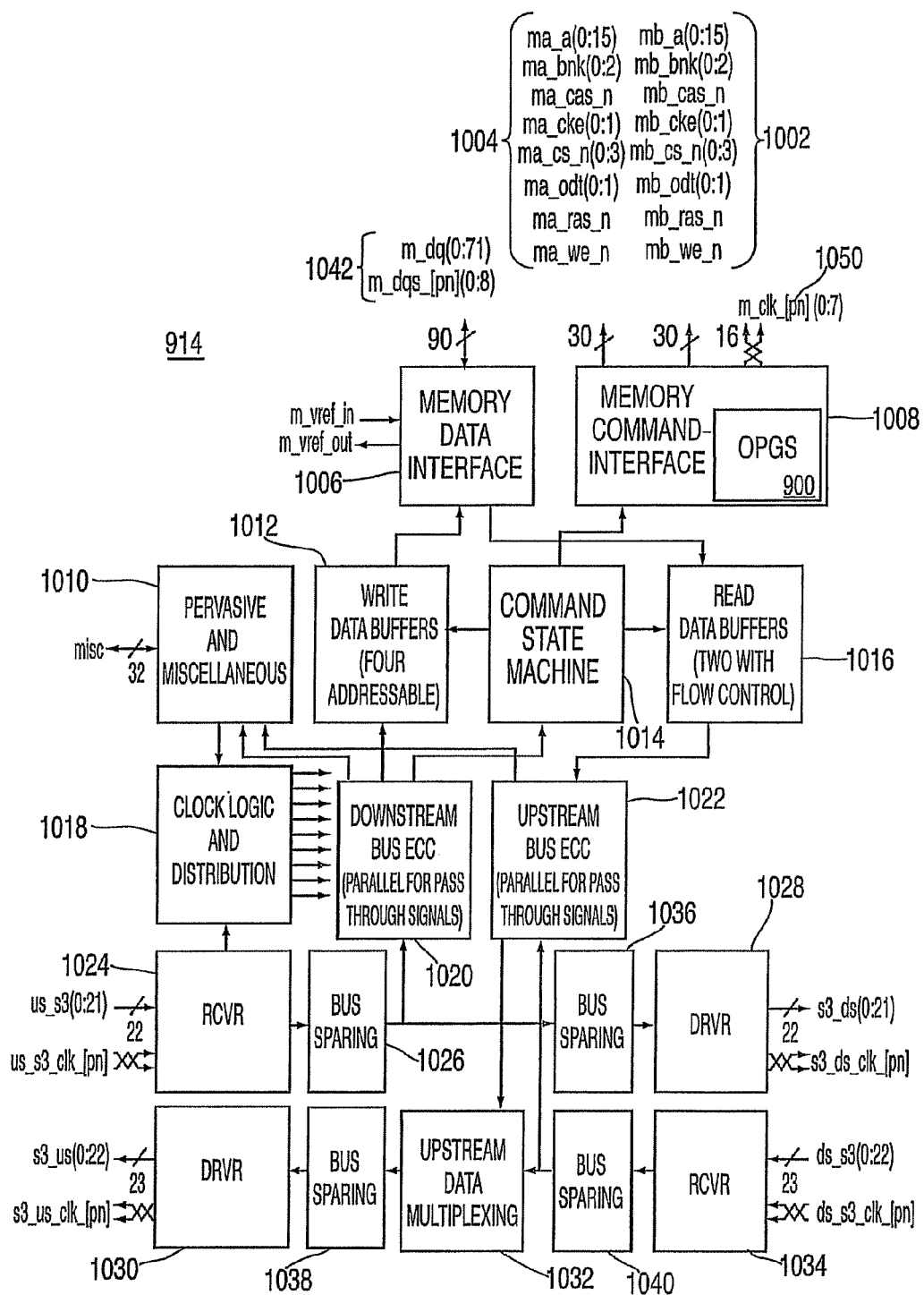
FIG. 10 is a block diagram of the high-level logic flow of the hub device located on a memory module in an exemplary embodiment.

FIG. 10 is a block diagram of the high-level logic flow of a hub device 914 located on a memory module 903 that may be implemented by exemplary embodiments. In an exemplary embodiment, the OPGS 900 (as noted earlier other oscillator structures described herein may also be utilized) is located in the memory command interface block 1008 in the hub device 914. The blocks in the lower left and right portions of the drawing (1024, 1028, 1030, 1034) are associated with receiving or driving the high-speed bus 906 depicted in FIG. 9. The upstream bus 902 passes information in the direction of the memory controller 910, and the downstream bus 906 passes information away from the memory controller 910.

Referring to FIG. 10, data, command, address, ECC, and clock signals from an upstream memory assembly (i.e., a memory module 903) or a memory controller 910 are received from the downstream memory bus 904 into a receiver module 1024. The receiver functional block 1024 provides macros and support logic for the downstream memory bus 904 and, in an exemplary embodiment of the present invention includes support for a twenty-two bit, high speed, slave receiver bus. The receiver functional block 1024 transmits the clock signals to a clock logic and distribution functional block 1018 (e.g., to generate the four to one clock signals). The clock logic and distribution functional block 1018 also receives data input from the pervasive and miscellaneous signals 1010. These signals typically include control and setup information for the clock distribution PLL's, test inputs for BIST (built-in self-test) modes, programmable timing settings, etc. The receiver functional block 1024 transfers the data, command, ECC and address signals to a bus sparing logic block 1026 to reposition, when applicable, the bit placement of the data in the event that a spare wire utilized during the transmission from the previous memory assembly. In an exemplary embodiment of the present invention, the bus sparing logic block 1026 is implemented by a multiplexer to shift the signal positions, if needed. Next, the original or re-ordered signals are input to another bus sparing logic block 1036 to modify, or reorder if necessary, the signal placement to account for any defective interconnect that may exist between the current memory assembly and a downstream memory assembly. The original or re-ordered signals are then input to a driver functional block 1028 for transmission, via the downstream memory bus 904, to the next memory module 903 in the chain. In an exemplary embodiment of the present invention, the bus sparing logic 1036 is implemented using a multiplexer. The driver functional block 1028 provides macros and support logic for the downstream memory bus 904 and, in an exemplary embodiment of the present invention, includes support for the twenty-two bit, high speed, low latency cascade bus drivers.

In addition to inputting the original or re-ordered signals to the bus sparing logic 1036, the bus sparing logic 1026 also inputs the original or re-ordered signals into a downstream bus ECC functional block 1020 to perform error detection and correction for the frame. The downstream bus ECC functional block 1020 operates on any information received or passed through the hub device 914 from the downstream memory bus 904 to determine if a bus error is present. The downstream bus ECC functional block 1020 analyzes the bus signals to determine if it they are valid. Next, the downstream bus ECC functional block 1020 transfers the corrected signals to a command state machine 1014. The command state machine 1014 inputs the error flags associated with command decodes or conflicts to a pervasive and miscellaneous functional block

1010. The downstream and upstream modules also present error flags and/or error data (if any) to the pervasive and miscellaneous functional block 1010 to enable reporting of these errors to the memory controller, processor, service processor or other error management unit.

Referring to FIG. 10, the pervasive and miscellaneous functional block 1010 transmits error flags and/or error data to the memory controller 910. By collecting error flags and/or error data from each memory module 903 in the chain, the memory controller 910 will be able to identify the failing segment(s), without having to initiate further diagnostics, though additional diagnostics may be completed in some embodiments of the design. In addition, once an installation selected threshold (e.g., one, two, ten, or twenty) for the number of failures or type of failures has been reached, the pervasive and miscellaneous functional block 1010, generally in response to inputs from the memory controller 910, may substitute the spare wire for the segment that is failing. In an exemplary embodiment of the present invention, error detection and correction is performed for every group of four transfers, thereby permitting operations to be decoded and initiated after half of the eight transfers, comprising a frame, are received. The error detection and correction is performed for all signals that pass through the memory module 903 from the downstream memory bus 904, regardless of whether the signals are to be processed by the particular memory module 903. The data bits from the corrected signals are input to the write data buffers 1012 by the downstream bus ECC functional block 1020.

The command state machine 1014 also determines if the corrected signals (including data, command and address signals) are directed to and should be processed by the memory module 903. If the corrected signals are directed to the memory module 903, then the command state machine 1014 determines what actions to take and may initiate DRAM action, write buffer actions, read buffer actions or a combination thereof. Depending on the type of memory module 903 (buffered, unbuffered, registered), the command state machine 1014 selects the appropriate drive characteristics, timings and timing relationships. The write data buffers 1012 transmit the data signals to a memory data interface 1006 and the command state machine 1014 transmits the associated addresses and command signals to a memory command interface 1008, consistent with the specification for the memory module type (buffered, unbuffered, registered), such as the exemplary prior generation DIMM described herein.

The memory command interface 1008 includes programmable timing circuitry to enable memory device timings to be met whether the devices are directly attached to the hub, or attached indirectly via one or more modules connected to the hub/adapter assembly. Unbuffered memory modules, which do not include re-drive or address, control and/or command data, will generally be operated with timings similar to those of direct-attached memory devices; however drive strengths on the memory command interface 1008 may be adjusted, as well as timing relationships between signals and/or signal groupings, based on the unbuffered module type (e.g. the memory device count). Registered memory modules generally include re-drive on one or more of address, control and command signals (shown as two sets of signals, 1002 and 1004, to enable connection to one or two independent memory busses, modules or memory ranks), thereby generally requiring a lower drive strength from the memory command interface 1008, but may require a shift in one or more of the address, control and command timings relative to data due to the re-drive delay on these one or more signals on the registered DIMM.

The memory command interface 1008, therefore, includes one or more of additional programmable drive strength, terminations, programmable timings (signal output times relative to clock) and clock relationships (signals may be sent on different clock boundaries) such that a wide range of memory device attachment methods (directly and indirectly attached to the command interface) can be supported. The memory clocks are also forwarded to the attached memory devices and/or modules via the 8 differential clock pairs (16 wires) 1050 from the memory command interface 1008, thereby enabling the memory command interface 1008 to correctly reference all output signals to the memory (and memory register) clocks in systems using octal data rate memory devices such as described in FIG. 11. The memory command interface 1008 may output differential clocks (as shown in FIG. 10) or may include two-dimensional or three dimensional oscillator circuitry to enable the memory command interface 1008 to generate multi-phase clocks from a differential clock. With the inclusion of octal phase generating circuitry 900 hub 914 of FIG. 10, the exemplary hub would be limited to driving 2 clock groups due to the 16 clock pins as shown in FIG. 10. Further exemplary embodiments would include additional (or fewer e.g., 12) clock pins on hub 914, enabling memory command interface 1008 to develop and drive two, three, four or more groups of quadrature, octal or other multi-phase clocks from a differential input clock or a multi-phase input clock having ½, ⅓, etc the phases of the output clock. In addition, an exemplary version of hub 914 might further include multiple phase generating circuits, including selection circuitry to enable operation of the hub with memory and/or other devices requiring 2, 4, 8, 12 or more clock phases.

Similarly, the memory data interface 1006 reads from and writes memory data 1042 to directly attached memory device(s) 909 and/or to one or more memory modules 903. As with the memory command interface 1008, the memory data interface 1006 includes one or more of programmable drive strength, terminations, programmable timings (signal output times relative to clock) and clock relationships (signals may be sent on different clock boundaries, relative to the clocks sourced from memory command interface 1008) such that a wide range of memory device attachment methods (directly and indirectly attached to the command interface) can be supported. With the exemplary interface programmability included in the memory data interface 1006 and memory command interface 1008, the exemplary hub device 914 offers a single device and/or package solution which can be used on a module as part of a memory subsystem, on an adapter card to connect to one or more attached memory modules, as an interface device (on a system board or card) to adapt a packetized, multi-transfer interface to an alternate parallel interface, such as a multi-drop, fly-by or other memory interface, etc.

Data signals to be transmitted to the memory controller 910 may be temporarily stored in the read data buffers 1016 after a command, such as a read command, has been executed by the memory module 903, consistent with the memory device 'read' timings. The read data buffers 1016 transfer the read data into an upstream bus ECC functional block 1022. The upstream bus ECC functional block 1022 generates check bits for the signals in the read data buffers 1016. The check bits and signals from the read data buffers 1016 are input to the upstream data multiplexing functional block 1032. The upstream data multiplexing functional block 1032 merges the data on to the upstream memory bus 902 via the bus sparing logic 1038 and the driver functional block 1030. If needed, the bus sparing logic 1038 may re-direct the signals to account for a defective segment between the current memory module 903 and the upstream receiving module (or memory controller). The driver functional block 1030 transmits the original or re-ordered signals, via the upstream memory bus 902, to the next memory assembly (i.e., memory module 903) or memory controller 910 in the chain. In an exemplary embodiment of the present invention, the bus sparing logic 1038 is implemented using a multiplexer to shift the signals. The driver functional block 1030 provides macros and support logic for the upstream memory bus 902 and, in an exemplary embodiment of the present invention, includes support for a twenty-three bit, high speed, low latency cascade driver bus.

Data, clock and ECC signals from the upstream memory bus 902 are also received by any upstream hub device 914 in any upstream memory module 903. These signals need to be passed upstream to the next memory module 903 or to the memory controller 910. Referring to FIG. 10, data, ECC and clock signals from a downstream memory assembly (i.e., a memory module 903) are received on the upstream memory bus 902 into a receiver functional block 1034. The receiver functional block 1034 provides macros and support logic for the upstream memory bus 902 and, in an exemplary embodiment of the present invention includes support for a twenty-three bit, high speed, slave receiver bus. The receiver functional block 1034 passes the data and ECC signals, through the bus sparing functional block 1040, to the upstream data multiplexing functional block 1032 and then to the bus sparing logic block 1038. The signals are transmitted to the upstream memory bus 902 via the driver functional block 1030.

In addition to passing the data and ECC signals to the upstream data multiplexing functional block 1032, the bus sparing functional block 1040 also inputs the original or re-ordered data and ECC signals to the upstream bus ECC functional block 1022 to perform error detection and correction for the frame. The upstream bus ECC functional block 1022 operates on any information received or passed through the hub device 914 from the upstream memory bus 902 to determine if a bus error is present. The upstream bus ECC functional block 1022 analyzes the data and ECC signals to determine if they are valid. Next, the upstream bus ECC functional block 1022 transfers any error flags and/or error data to the pervasive and miscellaneous functional block 1010 for transmission to the memory controller 910. In addition, once a pre-defined threshold for the number or type of failures has been reached, the pervasive and miscellaneous functional block 1010, generally in response to direction of the memory controller 910, may substitute the spare segment for a failing segment.

The block diagram in FIG. 10 is one implementation of a hub device 914 that may be utilized by exemplary embodiments of the present invention. Other implementations are possible without departing from the scope of the present invention.

Figure 11:
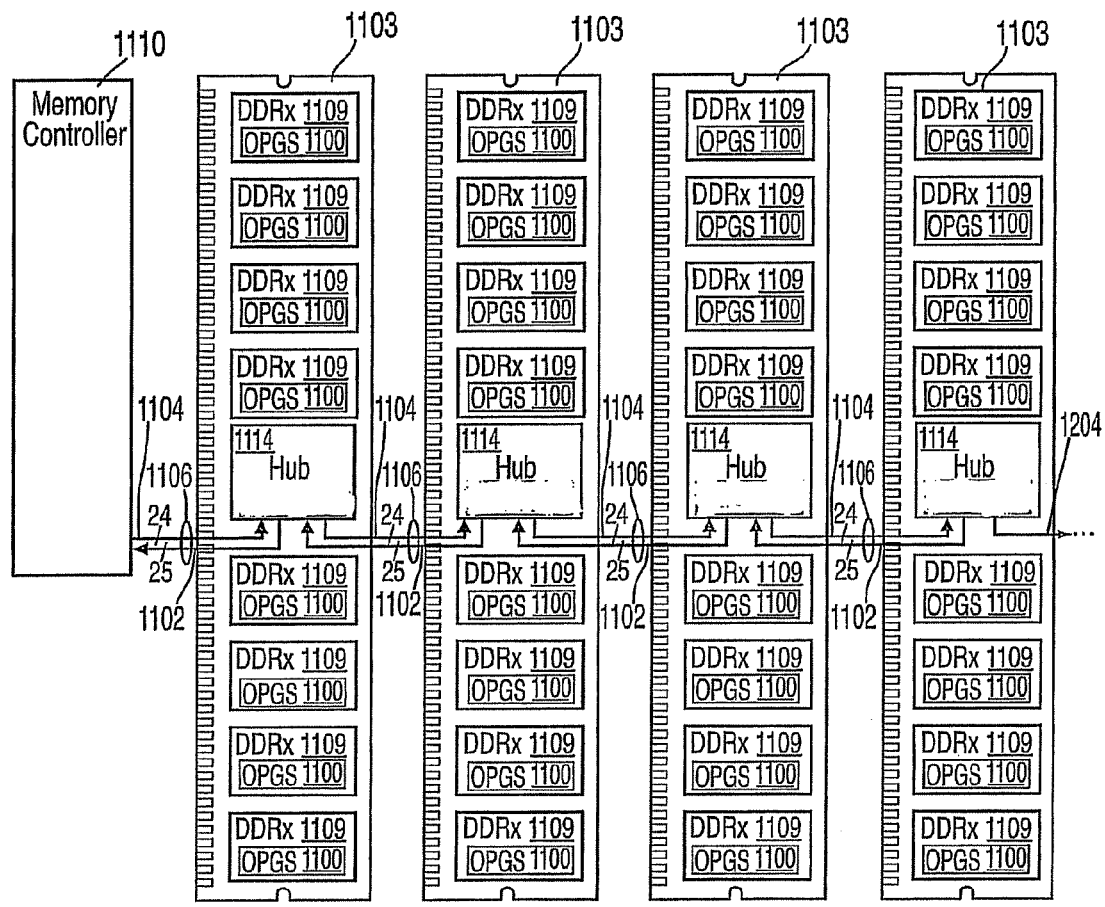
FIG. 11 depicts a memory structure that may be implemented by an exemplary embodiment.

FIG. 11 depicts a memory structure with cascaded memory modules 1103, high speed ODR (Octal Data Rate) memory devices 1109, hub device 1114 and unidirectional busses 1106 that may be implemented by exemplary embodiments. The unidirectional busses 1106 include an upstream memory bus 1102 and a downstream memory bus 1104. The one or more memory devices 1109 include a two-dimensional octal phase generating circuit 1100 which develops an eight-phase clock from a received differential clock 1050 to clock input and output registers on the memory device 1109. In an exemplary embodiment, the input and output register structure is consistent with contemporary DDR memory devices 1109, except that the register structure includes 4× the data storage and is operable with a 8-phase clock such that data can be transferred (e.g. written or read) at a rate of 8 times per 360 degree clock period, as compared to 2 times per 360 degree clock period for contemporary DDR devices. The two-dimensional octal phase generating circuit 1100 may be replaced in the memory device(s) 1109 by one or more of the two-dimensional and three-dimensional oscillator circuits described herein, with these new memory devices including further output register modifications, enabling the transfer of 4, 8, 12, 16, etc. bits per 360 degree clock cycle. By developing the octal clock signals internal to the memory devices, difficulties associated with the distribution and shielding of multiple clocks operating at a 4× higher clock frequency (e.g. the clock frequency required to achieve the same data rate using DDR devices) are eliminated, while retaining the benefits of low clock power, minimal start-up time when exiting from a low power state, etc.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Exemplary embodiments include a computing system with a processor(s) and an I/O unit(s) (e.g., requesters) interconnected to a memory system that contains a memory controller and memory devices. In exemplary embodiments, the memory system includes a processor or memory controller interfaced to a set of hub devices (also referred to as "hub chips"). The hub devices connect and interface to the memory devices via signals which include clock signals. In exemplary embodiments the computer memory system includes a physical memory array with a plurality of memory devices for storing data and instructions. These memory devices may be connected directly to the memory controller and/or indirectly coupled to the memory controller through hub devices. In exemplary embodiments, the hub-based computer memory system has memory devices attached to a communication hub device that is connected to a memory control device (e.g., a memory controller). Also in exemplary embodiments, the hub device is located on a memory module (e.g., a single substrate or physical device) that includes two or more hub devices that are cascaded interconnected to each other (and possibly to another hub device located on another memory module) via the memory bus.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. Contemporary DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller (s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or 'cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/ or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. In exemplary embodiments, dynamic memory device types include various forms of synchronous DRAMs, (e.g. QDR (Quad Data Rate) Synchronous DRAMs or other expected follow-on devices to DDR2 or DDR3 such as DDR4, DDR5 and related technologies such as Graphics RAMs, Video RAMs and/or LP RAMs (Low Power DRAMs)—the latter technologies often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be electrically connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc. Electrical interconnections on a memory module are often referred to as contacts, or pins, or tabs. Electrical interconnections on a connector are often referred to as contacts or pins.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices.

Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency (ies), and the number of clocks and/or clock phases planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, may include 2, 4, 8, 13 or more phases per 360 degree clock period and may be edge-aligned, center-aligned or placed in an alternate timing position relative to the data, command or address information. Exemplary open-loop quadrature (or octal, . . . ) clock generators may be used in one or more devices comprising the memory system/subsystem, wherein the memory device transfers data at a rate of one or more data transfers occurring for each output clock phase.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency (ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits of include the ability to generate a multi-phase clock in a manner that provides for a minimum impact on the output frequency while consuming a relatively small amount of power.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A ring oscillator structure for generating multiple phases using multiple unit oscillators, the structure comprising:
   a three-dimensional oscillator structure comprised of multiple two-dimensional oscillator structures, each two-dimensional oscillator structure comprised of:
   two or more unit oscillators, each unit oscillator implemented by a ring oscillator having M stages, where M is greater than or equal to two; and
   a loop coupling the two or more unit oscillators to generate multiple phases, the number of phases equal to the product of the number of unit oscillators and M, wherein the coupling aligns inputs and outputs of the unit oscillators sequentially between a first unit oscillator and a last unit oscillator and shifts the outputs of last unit oscillator by one position to loop back to the first unit oscillator; and wherein the three-dimensional oscillator structure aligns inputs and outputs of the unit oscillators sequentially between the first unit oscillator of a first two-dimensional oscillator structure and the last unit oscillator of a last two-dimensional oscillator structure and shifts the outputs of the last unit oscillator of the last two-dimensional oscillator structure by one position to loop back to the first unit oscillator of the first two-dimensional oscillator structure.

2. The structure of claim 1 wherein the three-dimensional oscillator structure is comprised of two two-dimensional oscillator structures.

3. The structure of claim 1 wherein the first unit oscillator is a two stage oscillator implemented by two inverters.

4. The structure of claim 1 wherein the first unit oscillator is a four stage oscillator implemented by four inverters.

5. The structure of claim 1 wherein the first and second unit oscillators are implemented by inverters.

6. A method for generating multiple phases using multiple unit oscillators, comprising:
    coupling multiple inverters to form multiple two-dimensional oscillator structures, each two-dimensional oscillator structure comprised of:
        two or more unit oscillators, each unit oscillator implemented by a ring oscillator having M stages, where M is greater than or equal to two; and
        a loop coupling the two or more unit oscillators to generate multiple phases, the number of phases equal to the product of the number of unit oscillators and M, wherein the coupling aligns inputs and outputs of the unit oscillators sequentially between a first unit oscillator and a last unit oscillator and shifts the outputs of last unit oscillator by one position to loop back to the first unit oscillator; and
    coupling the two-dimensional oscillator structures to form a three-dimensional oscillator structure, wherein the three-dimensional oscillator structure aligns inputs and outputs of the unit oscillators sequentially between the first unit oscillator of a first two-dimensional oscillator structure and the last unit oscillator of a last two-dimensional oscillator structure and shifts the outputs of the last unit oscillator of the last two-dimensional oscillator structure by one position to loop back to the first unit oscillator of the first two-dimensional oscillator structure.

* * * * *